United States Patent
Chan et al.

(10) Patent No.: US 6,872,608 B1
(45) Date of Patent: Mar. 29, 2005

(54) METHOD TO SELECTIVELY FORM POLY SIGE P TYPE ELECTRODE AND POLYSILICON N TYPE ELECTRODE THROUGH PLANARIZATION

(75) Inventors: Tze Ho Chan, Singapore (SG); Mousumi Bhat, Singapore (SG); Jeffrey Chee, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/697,746

(22) Filed: Oct. 30, 2003

(51) Int. Cl.$^7$ ............ H01L 21/338; H01L 21/00; H01L 21/84; H01L 21/8238
(52) U.S. Cl. ............ 438/176; 438/153; 438/199
(58) Field of Search ............ 438/153, 154, 438/176, 199, 300–305

(56) References Cited

U.S. PATENT DOCUMENTS

| | | | |
|---|---|---|---|
| 5,356,821 A | 10/1994 | Naruse et al. | 437/34 |
| 5,918,116 A | 6/1999 | Chittipeddi | 438/199 |
| 6,063,670 A | 5/2000 | Lin et al. | 438/275 |
| 6,133,084 A * | 10/2000 | Chang et al. | 438/238 |
| 6,342,438 B2 | 1/2002 | Yu et al. | 438/520 |
| 6,358,819 B1 | 3/2002 | Shelton et al. | 438/433 |
| 6,376,323 B1 | 4/2002 | Kim et al. | 438/373 |
| 6,696,328 B2 * | 2/2004 | Rhee et al. | 438/199 |

OTHER PUBLICATIONS

CS–01–093 U.S. Appl. No. 10/266,425, filed Oct. 8, 2002 to Chew–Hoe Ang et al., "Dual Si–Ge Polysilicon Gate with Different Ge Concentrations for CMOS Device Optimization".

* cited by examiner

*Primary Examiner*—Cuong Nguyen
(74) *Attorney, Agent, or Firm*—George O. Saile; Rosemary L. S. Pike

(57) ABSTRACT

A method for forming selective P type and N type gates is described. A first gate oxide layer is grown overlying a semiconductor substrate. A polysilicon layer is deposited overlying the first gate oxide layer. The polysilicon layer is patterned to form first NMOS gates. A second gate oxide layer is grown overlying the substrate. A polysilicon-germanium layer is deposited overlying the second gate oxide layer and the first gates. The polysilicon-germanium layer and first gates are planarized to a uniform thickness. The polysilicon first gates and the polysilicon-germanium layer are patterned to form second NMOS polysilicon gates and PMOS polysilicon-germanium gates.

15 Claims, 3 Drawing Sheets

METHOD TO SELECTIVELY FORM POLY SIGE P TYPE ELECTRODE AND POLYSILICON N TYPE ELECTRODE THROUGH PLANARIZATION

BACKGROUND OF THE INVENTION (1) Field of the Invention

The present invention relates to the fabrication of integrated circuit devices, and more particularly, to a method of selective gate N-type and P-type electrodes using dual gate electrode deposition and patterning in the fabrication of integrated circuits.

(2) Description of the Prior Art

For 0.1 μm CMOS and below, poly gate depletion is one of the critical issues in achieving high performance devices. Polysilicon-germanium (PolySiGe) is an attractive gate material because of its lower gate depletion and boron penetration and better electron mobility. The main drawback with PolySiGe is the degradation of NMOS under the current CMOS process conditions. The germanium ion reduces overall N-dopant activation in the polygate structure causing degradation to the NMOS structure. It is desired to form NMOS and PMOS gates selectively where N type gates are formed without SiGe and P type gates are formed with SiGe.

U.S. Pat. Nos. 6,358,819 B1 to Shelton et al, 5,918,116 to Chittipeddi, and 6,063,670 B1 to Lin et al disclose dual gate oxide processes. U.S. Pat. No. 6,342,438 B2 to Yu et al teaches doping PMOS and NMOS regions differently before patterning polysilicon gates. U.S. Pat. No. 5,356,821 to Naruse et al disclose epitaxial growth of SiGe gates for both NMOS and PMOS. U.S. Pat. No. 6,376,323 B1 to Kim et al teaches PolySiGe gates for both PMOS and NMOS with selective doping. Co-pending U.S. patent application Ser. No. 10/266,425 (CS-01-093) filed on Oct. 8, 2002 discloses a method for forming SiGe gates having different Ge concentrations for PMOS and NMOS.

SUMMARY OF THE INVENTION

Accordingly, a primary object of the invention is to provide a process for selective gate formation for N type and P type electrodes in the fabrication of integrated circuits.

A further object of the invention is to provide a process for forming selective gates for N type (without SiGe) and P type (with SiGe) electrodes in the fabrication of integrated circuits.

Another object of the invention is to provide a process for forming selective gates wherein polysilicon-germanium is used for thin P type gates and wherein polysilicon is used for N type gates and thick P type gates.

In accordance with the objects of the invention, a method for forming selective P type and N type gates is achieved. A first gate oxide layer is grown overlying a semiconductor substrate. A polysilicon layer is deposited overlying the first gate oxide layer. The polysilicon layer is patterned to form first NMOS gates. A second gate oxide layer is grown overlying the substrate. A polysilicon-germanium layer is deposited overlying the second gate oxide layer and the first gates. The polysilicon-germanium layer and first gates are planarized to a uniform thickness. The polysilicon first gates and the polysilicon-germanium layer are patterned to form second NMOS polysilicon gates and PMOS polysilicon-germanium gates.

Also in accordance with the objects of the invention, a method for forming selective thick and thin device P type and N type gates is achieved. A thick device area and a thin device area of a semiconductor substrate are provided. A first gate oxide layer is grown overlying the substrate in each of the device areas. A polysilicon layer is deposited overlying the first gate oxide layer. The polysilicon layer is patterned to form first NMOS and PMOS gates in the thick device area and to form first NMOS gates in the thin device area. A second gate oxide layer is grown overlying the substrate. A polysilicon-germanium layer is deposited overlying the second gate oxide layer and the first gates. The polysilicon-germanium layer and the first gates are planarized to a uniform thickness. The polysilicon first gates and the polysilicon-germanium layer are patterned to form second NMOS and PMOS polysilicon gates in the thick device area, second NMOS polysilicon gates in the thin device area, and second PMOS polysilicon-germanium gates in the thin device area in the fabrication of an integrated circuit device.

Also in accordance with the objects of the invention, a CMOS integrated circuit device is achieved. The CMOS integrated circuit device comprises NMOS and PMOS polysilicon gates in a thick device area of a wafer, NMOS polysilicon gates in a thin device area of the wafer, and PMOS polysilicon-germanium gates in the thin device area of the wafer.

BRIEF DESCRIPTION OF THE DRAWINGS

In the accompanying drawings forming a material part of this description, there is shown.

DESCRIPTION OF THE PREFERRED EMBODIMENTS

Figure 1:
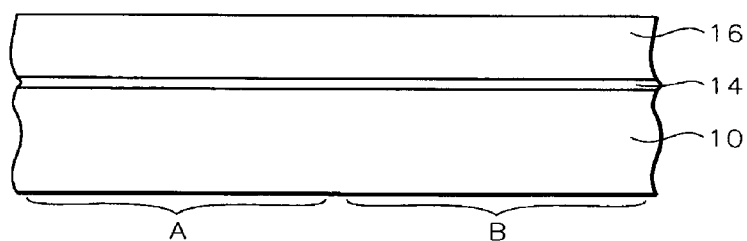
FIGS. 1 through 6 are cross-sectional representations of a preferred embodiment of the present invention.

Referring now more particularly to FIG. 1, there is shown a semiconductor substrate 10. This is preferably monocrystalline silicon. Isolation regions, such as shallow trench isolation (STI), not shown, are formed in the substrate to separate active regions. In the figures, an active region A for thick gate devices will be shown on the left and an active region B for thin gate devices will be shown on the right. For example, thick gate devices have a gate width of more than about 2400 Angstroms. Examples of thick gate devices are 2.5V input/output devices. Thin gate devices have a gate width of less than about 800 Angstroms. Examples of thin gate devices are 1.0V low threshold voltage devices.

A thermal gate oxide layer 14 is grown on the surface of the substrate to a thickness of between about 12 and 65 Angstroms, and preferably 45 to 65 Angstroms. A polysilicon layer 16 is deposited overlying the gate oxide layer to a thickness of between about 1500 and 2000 Angstroms.

Figure 2:
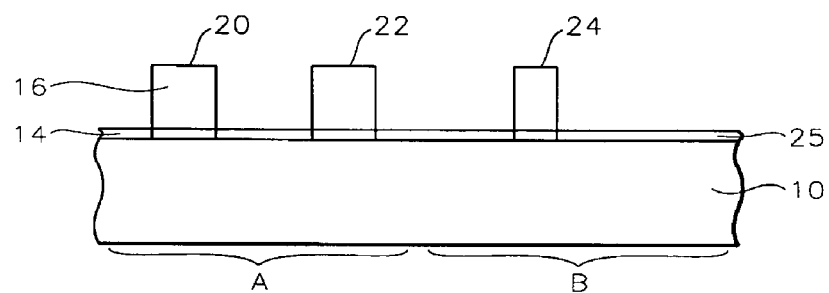

Referring now to FIG. 2, the polysilicon layer 16 is patterned to form first NMOS and PMOS gates 20 and 22, respectively, in the thick gate device area A and to form a thin first NMOS gate 24 in the thin gate device area B. After resist stripping and cleaning, a second thin gate oxide layer 25 is thermally grown on the surface of the substrate to a thickness of between about 12 and 20 Angstroms. This will form the gate oxide for the thin PMOS gate electrode to be formed subsequently.

Figure 3:
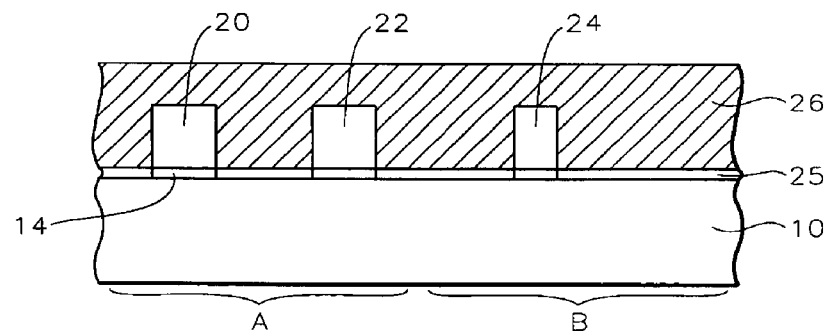

Referring now to FIG. 3, a PolySiGe layer 26 is deposited over the second gate oxide layer and over the first polysilicon gates to a thickness of between about 1700 and 2000 Angstroms.

Figure 4:
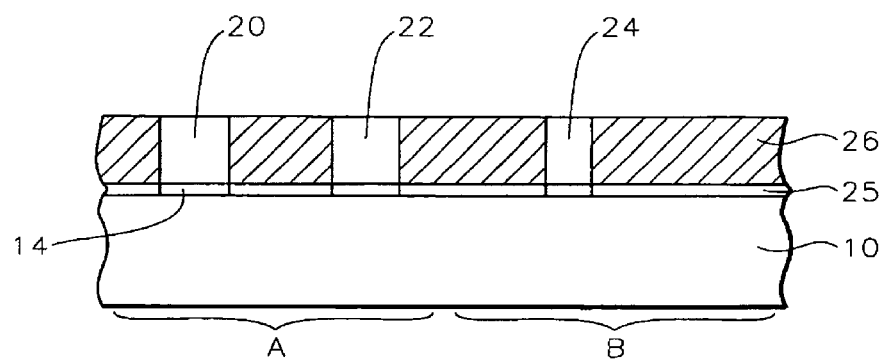

Now, the PolySiGe layer 26 is planarized by chemical mechanical polishing (CMP) to achieve a uniform gate thickness (height) of between about 1500 and 2000 Angstroms as shown in FIG. 4. The planarization step facilitates gate patterning subsequently.

Figure 5:
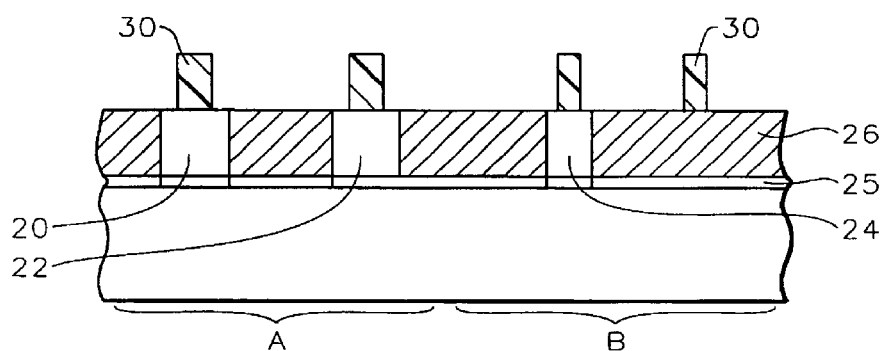
Figure 6:
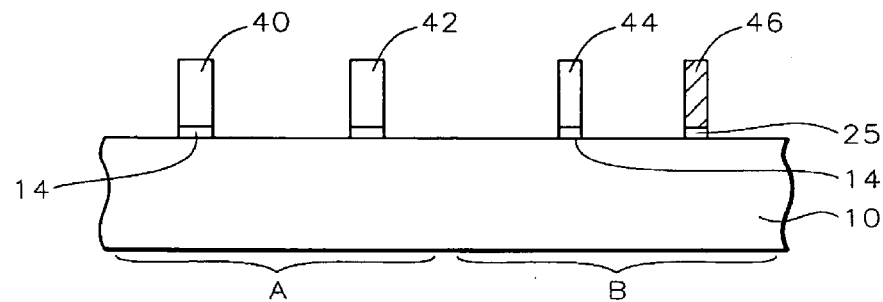

A mask 30 is formed over the gate layers to define thick and thin gate electrodes as shown in FIG. 5. The polysilicon and PolySiGe layers are etched away where they are not covered by the mask pattern 30 to form gate electrodes as shown in FIG. 6. In the thick device area A, polysilicon NMOS gate electrode 40 and polysilicon PMOS gate electrode 42 have been formed. In the thin device area B, polysilicon NMOS gate electrode 44 has been formed and PolySiGe PMOS gate electrode 46 has been formed. For example, the thick gates have a gate width of between about 2400 and 3000 Angstroms and the thin gates have a gate width of between about 700 and 850 Angstroms.

Figure 7:
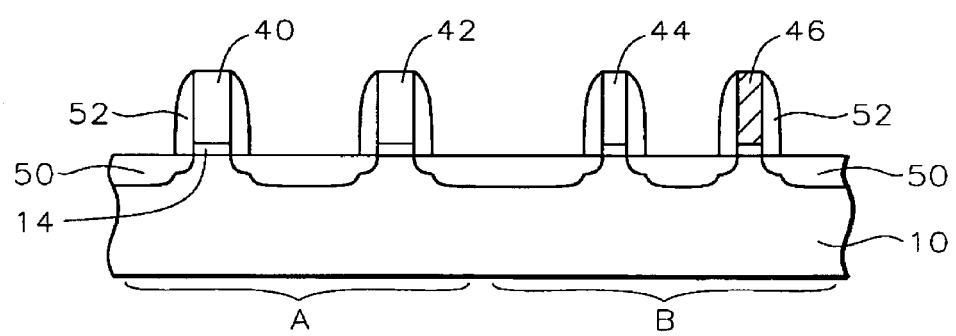
FIG. 7 is a cross-sectional representation of a completed integrated circuit fabricated according to a preferred embodiment of the present invention.

FIG. 7 illustrates the completed gate electrode devices having associated source/drain regions 50 and dielectric sidewall spacers 52.

The process of the present invention provides a simple, manufacturable dual gate process. For optimum performance, thick gate devices have polysilicon gate electrodes while thin PMOS devices are PolySiGe gate electrodes.

While the invention has been particularly shown and described with reference to the preferred embodiments thereof, it will be understood by those skilled in the art that various changes in form and details may be made without departing from the spirit and scope of the invention.

What is claimed is:

1. A method of forming dual gates in the fabrication of an integrated circuit device comprising:
    growing a first gate dielectric layer overlying a substrate;
    depositing a polysilicon layer overlying said first gate dielectric layer;
    patterning said polysilicon layer to form first NMOS gates;
    thereafter growing a second gate dielectric layer overlying said substrate;
    depositing a polysilicon-germanium layer overlying said second gate dielectric layer and said first gates;
    planarizing said polysilicon-germanium layer and said first gates to a uniform thickness; and
    thereafter patterning said polysilicon first gates and said polysilicon-germanium layer to form second NMOS polysilicon gates and PMOS polysilicon-germanium gates in the fabrication of an integrated circuit device.

2. The method according to claim 1 wherein said first gate dielectric layer comprises an oxide grown to a thickness of between about 12 and 65 Angstroms.

3. The method according to claim 1 wherein said polysilicon layer is deposited to a thickness of between about 1500 and 2000 Angstroms.

4. The method according to claim 1 wherein said second gate dielectric layer is an oxide grown to a thickness of between about 12 and 20 Angstroms.

5. The method according to claim 1 wherein said polysilicon-germanium layer is deposited to a thickness of between about 1700 and 2000 Angstroms.

6. The method according to claim 1 wherein said uniform thickness is between about 1500 and 2000 Angstroms.

7. A method of forming dual gates in the fabrication of an integrated circuit device comprising:
    providing a thick device area and a thin device area of a substrate;
    growing a first gate dielectric layer overlying said substrate in each of said device areas;
    depositing a polysilicon layer overlying said first gate dielectric layer;
    patterning said polysilicon layer to form first NMOS and PMOS gates in said thick device area and to form first NMOS gates in said thin device area;
    growing a second gate dielectric layer overlying said substrate;
    depositing a polysilicon-germanium layer overlying said second gate dielectric layer and said first gates;
    planarizing said polysilicon-germanium layer and said first gates to a uniform thickness; and
    thereafter patterning said polysilicon first gates and said polysilicon-germanium layer to form second NMOS and PMOS polysilicon gates in said thick device area, second NMOS polysilicon gates in said thin device area, and second PMOS polysilicon-germanium gates in said thin device area in the fabrication of an integrated circuit device.

8. The method according to claim 7 wherein said first gate dielectric layer is an oxide grown to a thickness of between about 12 and 65 Angstroms.

9. The method according to claim 7 wherein said polysilicon layer is deposited to a thickness of between about 1500 and 2000 Angstroms.

10. The method according to claim 7 wherein said second gate dielectric layer is an oxide grown to a thickness of between about 12 and 20 Angstroms.

11. The method according to claim 7 wherein said polysilicon-germanium layer is deposited to a thickness of between about 1700 and 2000 Angstroms.

12. The method according to claim 7 wherein said uniform thickness is between about 1500 and 2000 Angstroms.

13. The method according to claim 7 wherein said NMOS and PMOS polysilicon gates in said thick device area have a width of between about 2400 and 3000 Angstroms.

14. The method according to claim 7 wherein said NMOS polysilicon gates in said thin device area have a width of between about 700 and 850 Angstroms.

15. The method according to claim 7 wherein said PMOS polysilicon-germanium gates in said thin device area have a width of between about 700 and 850 Angstroms.

* * * * *